(12) United States Patent
Hyland et al.

(10) Patent No.: US 7,723,237 B2
(45) Date of Patent: May 25, 2010

(54) METHOD FOR SELECTIVE REMOVAL OF DAMAGED MULTI-STACK BILAYER FILMS

(75) Inventors: Sandra Hyland, Guilderland, NY (US); Ian J. Brown, Austin, TX (US); Yannick Feurprier, East Greenbush, NY (US)

(73) Assignee: Tokyo Electron Limited, Tokyo (JP)

( * ) Notice: Subject to any disclaimer, the term of this patent is extended or adjusted under 35 U.S.C. 154(b) by 582 days.

(21) Appl. No.: 11/611,611

(22) Filed: Dec. 15, 2006

(65) Prior Publication Data
US 2008/0142988 A1   Jun. 19, 2008

(51) Int. Cl.
*H01L 21/461* (2006.01)
*H01L 21/302* (2006.01)

(52) U.S. Cl. .............................. 438/706; 257/E21.215; 257/E21.241

(58) Field of Classification Search ................... 438/706
See application file for complete search history.

(56) References Cited

U.S. PATENT DOCUMENTS

| | | |
|---|---|---|
| 2002/0195423 A1 | 12/2002 | Patel et al. |
| 2006/0057835 A1 | 3/2006 | Anderson et al. |
| 2006/0079025 A1 | 4/2006 | Kripesh et al. |
| 2006/0105565 A1 | 5/2006 | Liu et al. |
| 2006/0194435 A1 | 8/2006 | Nishimura et al. |

*Primary Examiner*—Alexander G Ghyka
(74) *Attorney, Agent, or Firm*—Oblon, Spivak, McClelland, Maier & Neustadt, L.L.P.

(57) ABSTRACT

A method for removing a damaged low dielectric constant material following an etch process, an ashing process, or a wet cleaning process is described. A dry, non-plasma removal process is implemented to remove a thin layer of damaged material on a feature following formation of the feature. The dry, non-plasma removal process comprises a chemical treatment of the damaged material, followed by a thermal treatment of the chemically treated surface layer. The two steps, chemical and thermal treatment, can be repeated.

21 Claims, 19 Drawing Sheets

METHOD FOR SELECTIVE REMOVAL OF DAMAGED MULTI-STACK BILAYER FILMS

CROSS-REFERENCE TO RELATED APPLICATIONS

This application is related to pending U.S. patent application Ser. No. 11/390,193, entitled "METHOD FOR REMOVING DAMAGED DIELECTRIC MATERIAL" (TEA-024), filed on Mar. 28, 2006; and pending U.S. patent application Ser. No. 11/390,197, entitled "METHOD AND SYSTEM FOR PATTERNING A DIELECTRIC FILM" (TEA-026), filed on Mar. 28, 2006. The entire contents of these applications are herein incorporated by reference in their entirety.

BACKGROUND OF THE INVENTION

1. Field of the Invention

The present invention relates to a method for performing a removal process on a dielectric film, and more particularly to a method for removing damaged material within a feature in a bilayer film on a substrate following an etching, ashing or wet cleaning process.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials during production of the IC. Such low-k materials have also proven useful for low temperature processing. Thus, in recent years, low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

While low-k materials are promising for fabrication of semiconductor circuits, the present inventors have recognized that these films also provide many challenges. First, low-k films tend to be less robust than more traditional dielectric layers and can be damaged during wafer processing, such as by etch and plasma ashing processes generally used in patterning the dielectric layer. Further, some low-k films tend to be highly reactive when damaged, particularly after patterning, thereby allowing the low-k material to absorb water and/or react with other vapors and/or process contaminants that can alter the electrical properties of the dielectric layer. These challenges may be an impediment to use of low-k films in some device applications.

SUMMARY OF THE INVENTION

Accordingly, one embodiment is to remove damaged layers on a thin film for use in electronic devices.

Another embodiment is to remove damaged layers on a low dielectric constant (low-k) film following an etching process, an ashing process, or a wet cleaning process.

Yet another embodiment is to use a dry non-plasma etching process to remove damaged layers on a low-k film following a low-k film etching process, ashing process or wet cleaning process.

Still another embodiment is to remove damaged layers in a multi-stack bilayer film, such as a trench-via structure, following an etching process, an ashing process, or a wet cleaning process.

These and/or other embodiments may be provided by a method of treating a dielectric film on a substrate. The method includes: disposing the substrate having the dielectric film and a capping layer overlying the dielectric film in a treatment system, wherein a pattern has been transferred to the capping layer and the dielectric film in order to form a feature through the capping layer and within the dielectric film, and wherein a surface layer of the dielectric film has been exposed to an etching plasma during the pattern transfer; and performing a dry non-plasma removal process on the capping layer and the dielectric film to remove the exposed surface layer of the dielectric film and a portion of the capping layer, the removal process comprising: exposing the exposed surface layer of the dielectric film and the portion of the capping layer to a process gas comprising HF or $NH_3$ or a combination thereof in order to chemically alter the exposed surface layer of the dielectric film and the portion of the capping layer; and thermally treating the chemically altered exposed surface layer of the dielectric film and the chemically altered portion of the capping layer in order to desorb the chemically altered surface layer and the chemically altered portion, wherein the performing the dry non-plasma removal process substantially avoids the formation of an overhang within the feature.

Another aspect of the invention includes a method of forming a feature in a low-k film formed on a substrate. The method includes: forming the bilayer film on the substrate, wherein the bilayer film comprises a dielectric layer and a capping layer overlying the dielectric layer; forming a mask pattern on the bilayer film, the mask pattern having a pattern feature corresponding to a bilayer feature to be formed in the bilayer film; etching the bilayer feature in the bilayer film using a dry plasma etch process; and performing a dry non-plasma removal process on the bilayer feature to remove a surface layer of the bilayer feature that has been at least one of damaged or activated by the plasma etch process, wherein the performing the dry non-plasma removal process substantially avoids the formation of an overhang within the bilayer feature.

DETAILED DESCRIPTION OF PREFERRED EMBODIMENTS

Figure 1A:
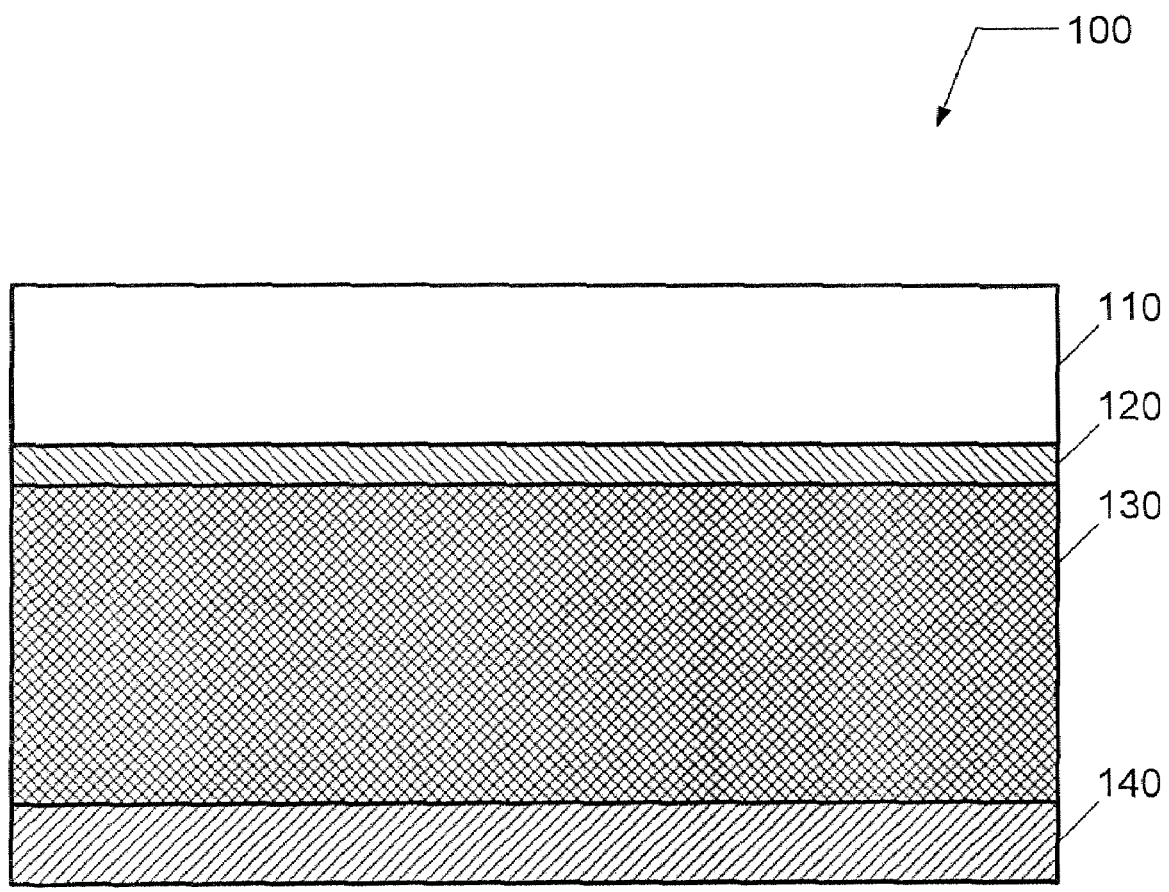
FIGS. 1A through 1G depict an exemplary sequence for processing a bilayer film on a substrate according to an embodiment.

In the following description, in order to facilitate a thorough understanding of the invention and for purposes of explanation and not limitation, specific details are set forth, such as a particular geometry of the treatment system and descriptions of various components and processes used therein. However, it should be understood that the invention may be practiced in other embodiments that depart from these specific details.

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure of the light-sensitive material to a geometric pattern of electro-magnetic (EM) radiation using, for example, a micro-lithography system, followed by the removal of the irradiated regions of the light-sensitive material (as in the case of positive photo-resist), or non-irradiated regions (as in the case of negative photo-resist) using a developing solvent.

Additionally, multi-layer masks and hard masks can be implemented for etching features in a thin film. For example, when etching features in a thin film using a hard mask, the mask pattern in the light-sensitive layer is transferred to the hard mask layer using a separate etch step preceding the main etch step for the thin film. The hard mask can, for example, be selected from several materials for silicon processing including silicon-containing materials or carbon-containing materials or a combination thereof, such as silicon dioxide ($SiO_2$), silicon nitride ($Si_3N_4$), and carbon. Further yet, the features formed within the thin film may also include additional layers such as, but not limited to, etch stop layers, chemical-mechanical planarization (CMP) stop layers, capping layers, etc.

Referring now to the drawings, wherein like reference numerals designate identical or corresponding parts throughout the several views, FIGS. 1A through 1G illustrate a method of forming a pattern in a dielectric film according to an embodiment. The method combines various aspects of the invention including using a hard mask and treating the exposed surfaces of the etched pattern in the dielectric film in order to remove layers damaged on the dielectric film as a consequence of the dielectric film etching or ashing processes. However, aspects of the process in FIGS. 1A-1G may be used separately from one another as discussed below. Additionally, FIG. 2 presents a flow chart 200 of performing the method according to one embodiment.

Figure 1B:
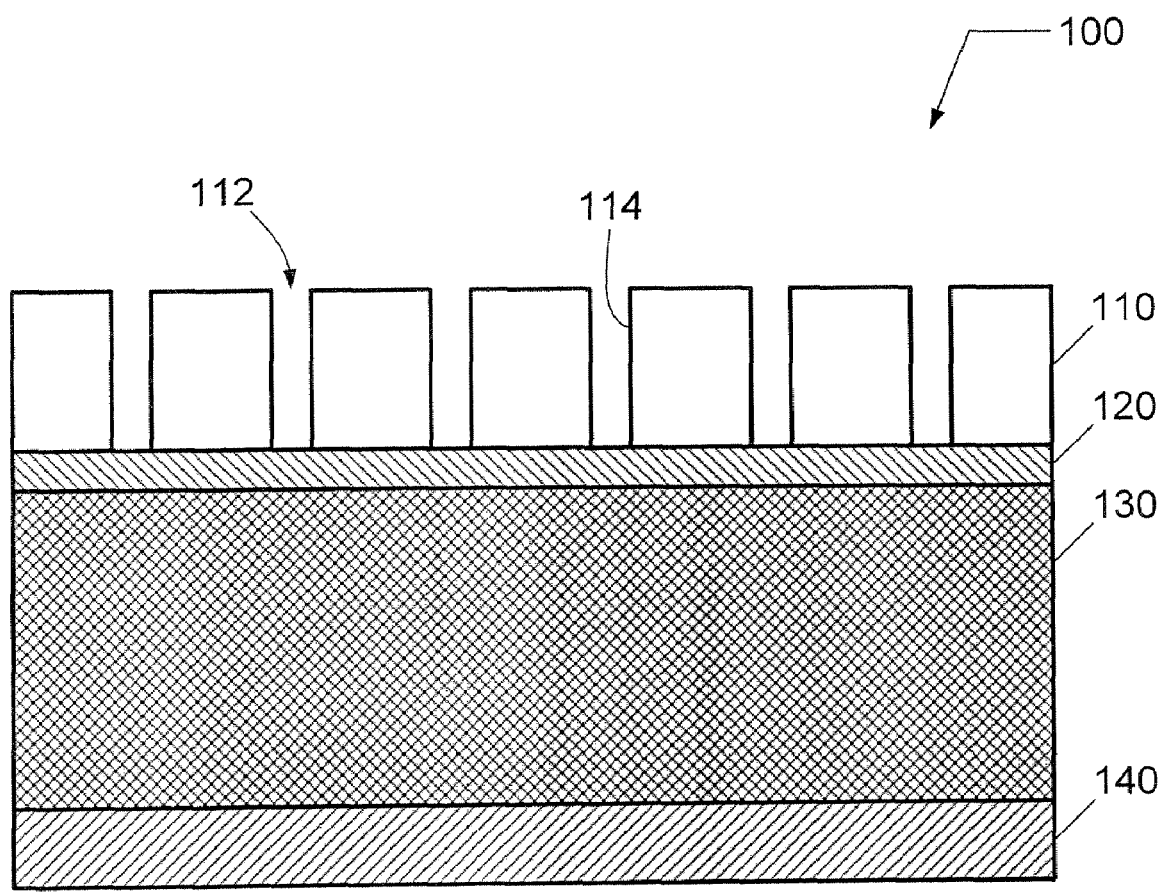
Figure 2:
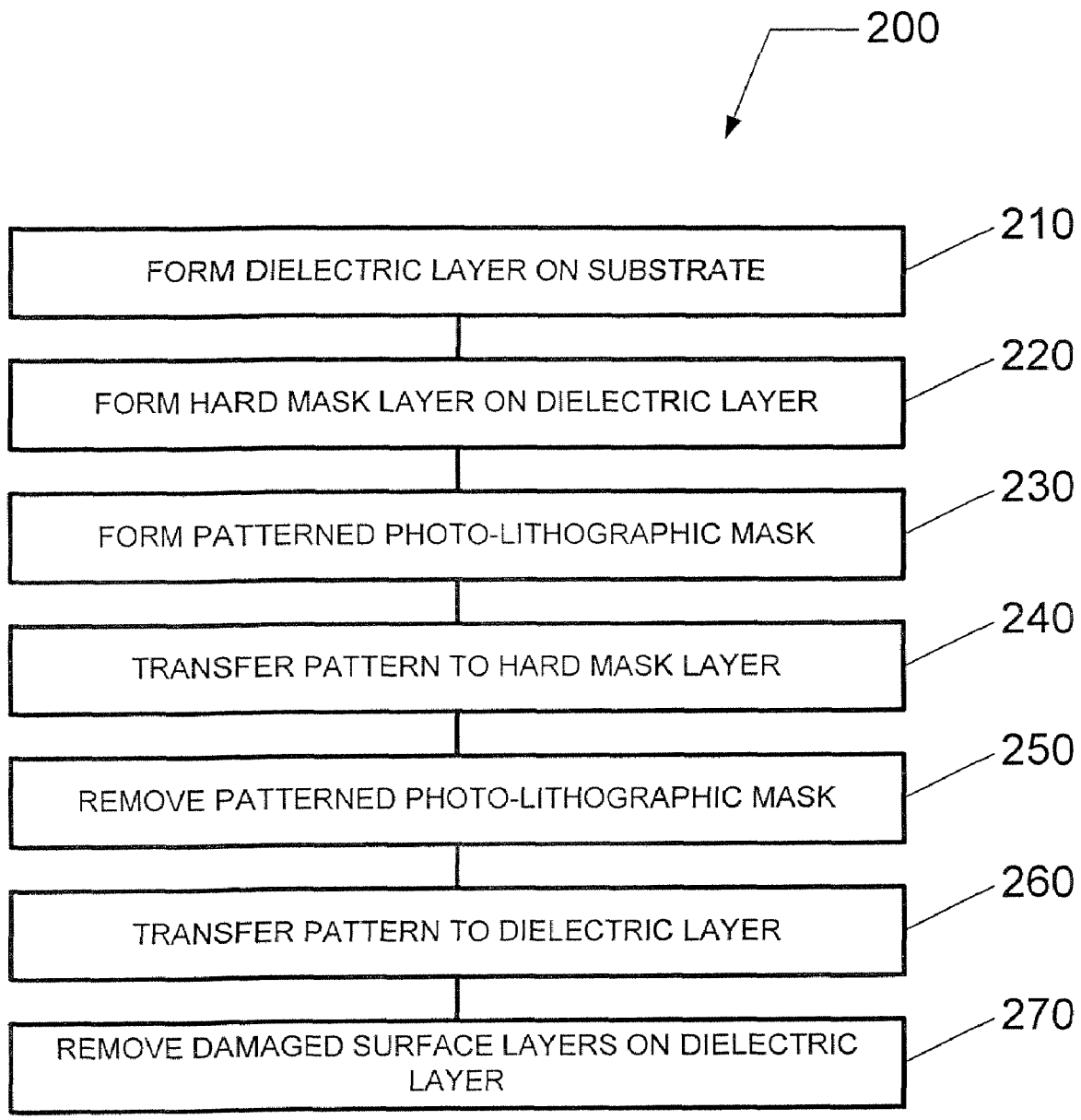
FIG. 2 illustrates a method of processing a substrate according to an embodiment.

As shown in FIGS. 1A, 1B, and 2, the device 100 includes a dielectric film 130 formed in step 210 on an upper surface of a substrate 140 that may or may not include additional layers. The substrate 140 may be a semiconductor, a metallic conductor, or any other substrate to which the dielectric film is to be formed upon. The dielectric film has a nominal dielectric constant value less than the dielectric constant of $SiO_2$, which is approximately 4 (e.g., the dielectric constant for thermal silicon dioxide can range from 3.8 to 3.9). More specifically, the dielectric film 130 may have a dielectric constant of less than 3.0, or a dielectric constant ranging from 1.6 to 2.7.

The dielectric film 130 can be formed using chemical vapor deposition (CVD) techniques, or spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate are well known to those skilled in the art of both spin-on dielectric technology and CVD dielectric technology.

The dielectric film 130 can, for example, be characterized as a low dielectric constant (or low-k) dielectric film. The dielectric film 130 may include an organic, inorganic, or inorganic-organic hybrid material or a combination of two or more thereof. Additionally, the dielectric film 130 may be porous or non-porous. For example, the dielectric film may include an inorganic, silicate-based material, such as oxidized organosilane (or organo siloxane), deposited using CVD techniques. Examples of such films include Black Diamond™ CVD organosilicate glass (OSG) films commercially available from Applied Materials, Inc., or Coral™ CVD films commercially available from Novellus Systems. Additionally, for example, porous dielectric films can include single-phase materials, such as a silicon oxide-based matrix having $CH_3$ bonds that are broken during a curing process to create small voids (or pores). Additionally, for example, porous dielectric films can include dual-phase materials, such as a silicon oxide-based matrix having pores of organic material (e.g., porogen) that is evaporated during a curing process.

Alternatively, the dielectric film 130 may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the dielectric film 130 can include an organic material deposited using SOD techniques. Examples of such films include SiLK-I, SiLK-J, SiLK-H, SiLK-D, and porous SiLK semiconductor dielectric resins commercially available from Dow Chemical, FLARE™, and NANOGLASS® which is commercially available from Honeywell.

In the embodiment of FIGS. 1A-1G, once the dielectric film 130 is prepared, a cap layer 120 is formed in step 220 on an upper surface thereof. The cap layer 120 can include silicon oxide ($SiO_x$), silicon nitride ($Si_yN_z$), and carbon, together, or any combination thereof for example. For instance, the cap layer 120 may serve as a capping layer for the underlying dielectric film 130.

Thereafter, a patterned mask layer 110 is formed in step 230 on an upper surface of the cap layer 120. The patterned mask layer 110 can include a photo-lithographic pattern 112 formed in a layer of light-sensitive material, such as photo-resist, using photo-lithography. Alternatively, the patterned mask 110 can include a bilayer mask, or multilayer mask, having an anti-reflective coating (ARC), such as a buried ARC (BARC) layer or a tunable etch resistant ARC (TERA) layer, embedded therein. The ARC layer may be an organic ARC or an inorganic ARC. Alternatively yet, the patterned mask 110 can include a multilayer mask having a thin layer of photoresist overlying an ARC layer overlying an organic planarization layer (OPL). The thickness of the photoresist can be relatively thin and the thickness of the ARC layer can be tuned to the exposure wavelength, while the thickness of the OPL can be arbitrary depending upon the requirements of the etch process.

For example, the mask layer (or layers), i.e., cap layer 120 or patterned mask layer 110, can be formed using a track system, or chemical vapor deposition (CVD) system. The track system can be configured for processing 248 nm resists, 193 nm resists, 157 nm resists, EUV resists, (top/bottom) anti-reflective coatings (TARC/BARC), and top coats. For example, the track system can include a Clean Track ACT 8, or ACT 12 resist coating and developing system commercially available from Tokyo Electron Limited (TEL). Other systems and methods for forming a photoresist film on a substrate are well known to those skilled in the art of spin-on resist technology. Additionally, for example, the mask pattern can be formed using any suitable conventional stepping lithographic system, or scanning lithographic system.

Advanced photo-lithography for smaller geometries (i.e., 45 nm, 32 nm, and beyond) is generally constrained by the requirements to: optimize the accurate communication of photo-lithographic pattern 112 to the mask layer 110, minimize the thickness of the mask layer 110 to prevent pattern collapse, optimize the composition and thickness of the mask layer 110 for accurate communication of the pattern 112 from the mask layer 110 to the underlying layer, and minimize the transfer of line-edge-roughness (LER) in sidewall 114 of the photo-lithographic pattern 112 to the underlying film.

Conventionally, the mask pattern in a light sensitive layer is transferred to the underlying layer(s) using a plasma etch process. Due to the anisotropic nature of the plasma etch, the pattern in the light sensitive layer can be transferred to the underlying layer(s) with high precision. Also in a conventional process using a multi-layer mask, the patterned light sensitive layer is first used to etch the underlying mask sub-layers, and the multi-layer mask is subsequently used together to etch the pattern into the dielectric layer. Then, the light sensitive layer and/or residue thereof are removed using a stripping, ashing or wet cleaning process, for example. The present inventors have recognized that exposing the etched dielectric feature to a light sensitive layer removal process can damage the dielectric feature and/or change characteristics of the dielectric material within the dielectric feature. Such damage is in addition to damage of the dielectric feature that can be caused by etching of the feature itself.

Figure 1C:
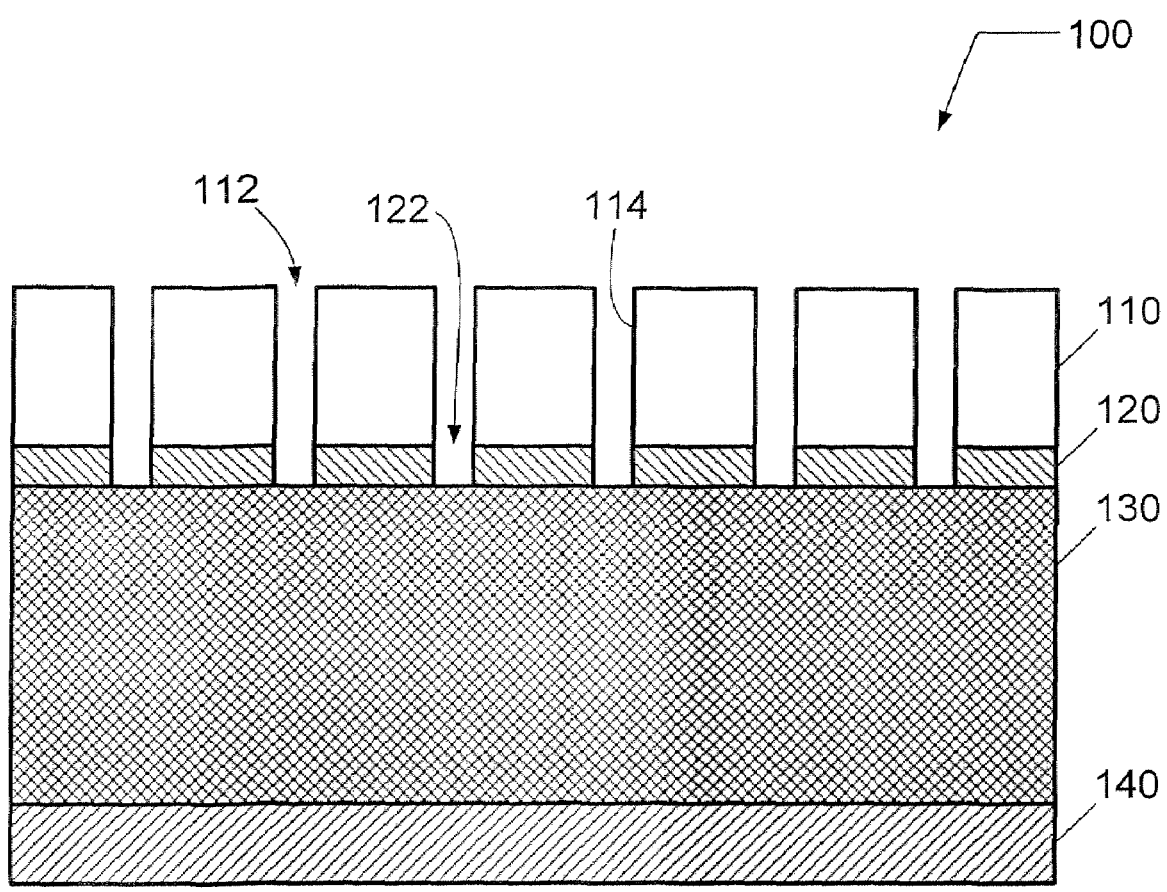
Figure 1D:
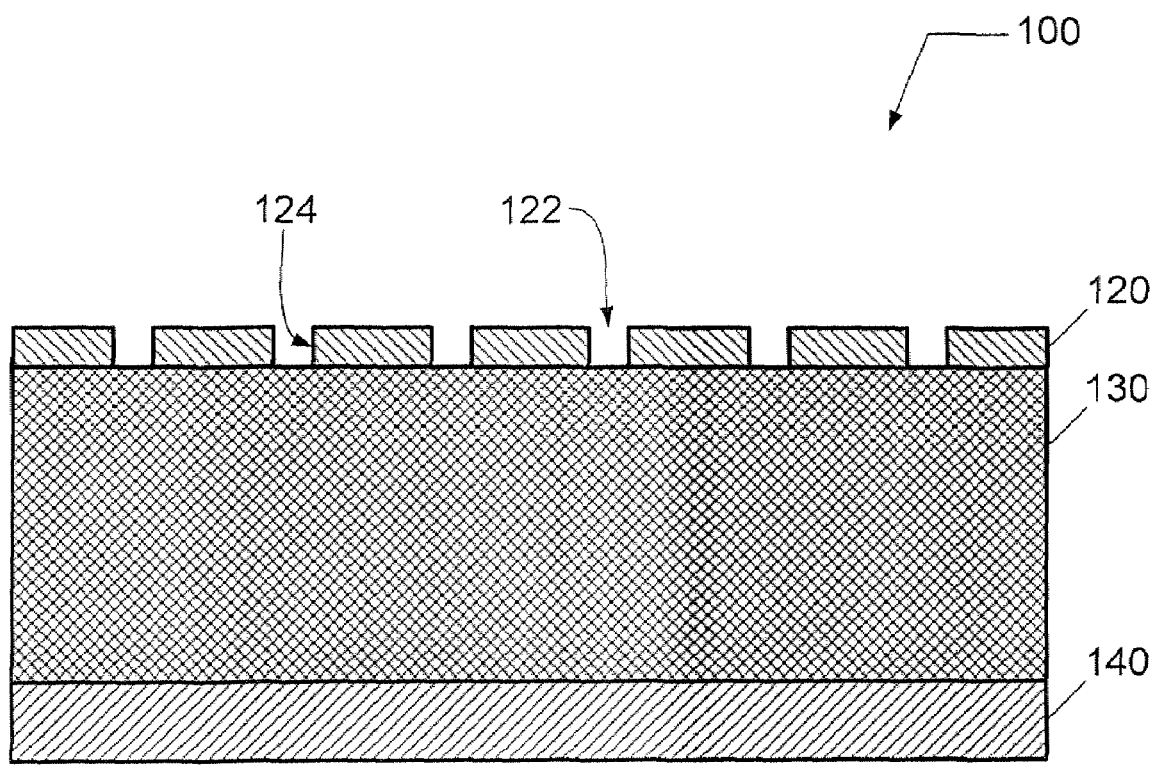

As shown in FIGS. 1C and 1D, the photo-lithographic pattern 112 can be transferred in step 240 to the cap layer 120 using a dry etching process, such as a dry non-plasma etching process or dry plasma etching process. Additional details are provided in pending U.S. patent application Ser. No. 11/390, 193, entitled "METHOD FOR REMOVING DAMAGED DIELECTRIC MATERIAL" (TEA-024), filed on Mar. 28, 2006, and pending U.S. patent application Ser. No. 11/390, 197, entitled "METHOD AND SYSTEM FOR PATTERNING A DIELECTRIC FILM" (TEA-026), filed on Mar. 28, 2006; the entire contents of these applications are herein incorporated by reference in their entirety.

As shown in FIG. 1D, once the mask pattern 122 is formed in the cap layer 120, the mask layer 110 can be removed in step 250 using a wet or dry stripping/ashing process prior to etching the dielectric layer 130. As one advantage, for instance, the removal of the mask layer 110 prior to etching the dielectric layer 130 may be simpler, due to the lack of hardened crusts resulting from the dielectric layer etching process. Additionally, for instance, the removal of the mask layer 110 prior to the dielectric layer etch minimizes the exposure of dielectric layer 130 to a wet clean process when applying strip chemicals during a wet stripping process, or an ashing process when using an oxidizing plasma to remove photoresist and post-etch residue. Advanced (porous or non-porous) dielectric materials can be damaged when exposed to these etching, stripping and/or ashing processes, and thus, prior removal of the light sensitive layer can minimize damage of the dielectric layer. Alternatively, the mask layer 110 may not be removed in step 250. For example, the mask layer 110 may be removed following the transfer of the pattern to dielectric layer 130. Additionally, for example, when the mask layer 110 comprises a layer of photoresist, an ARC layer and an OPL, the photoresist and the ARC layer may be consumed during the etching of the cap layer 120 and the dielectric layer 130. Once the pattern is transferred to the cap layer 120 and the dielectric layer 130, the remaining OPL may be removed.

Figure 1E:
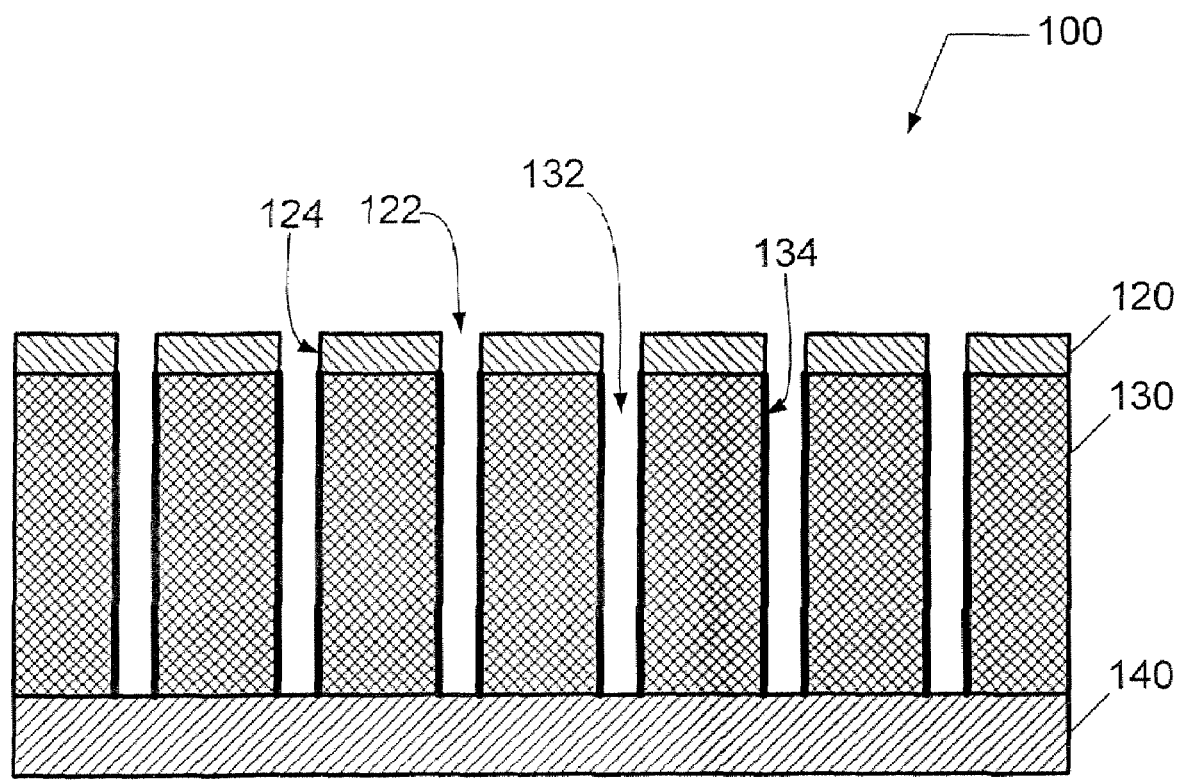

In step 260, as shown in FIG. 1E, hard mask pattern 122 is transferred to dielectric layer 130 using dry plasma etching. For instance, when etching oxide dielectric films such as silicon oxide, silicon dioxide, etc., or when etching inorganic low-k dielectric films such as oxidized organosilanes, the etch gas composition generally includes a fluorocarbon-based chemistry such as at least one of $C_4F_8$, $C_5F_8$, $C_3F_6$, $C_4F_6$, $CF_4$, etc., or a fluorohydrocarbon-based chemistry such as at least one of $CHF_3$, $CH_2F_2$, etc., and at least one of an inert gas, oxygen, and CO. Additionally, for example, when etching organic low-k dielectric films, the etch gas composition generally includes at least one of a nitrogen-containing gas, and a hydrogen-containing gas. The techniques for selectively etching a dielectric film, such as those described earlier, are well known to those skilled in the art of dielectric etch processes.

During etching or during the removal of any remaining residue or both, exposed surfaces within the feature 132 formed in the dielectric layer 130, such as sidewalls 124, 124", and 134, can be damaged, or activated. The damage or activation incurred by these surfaces can lead to the absorption of water, or the adhesion of contaminants and/or chemicals during etch processing (i.e., dry etching of the dielectric layer, or photo-lithographic mask removal during ashing following the dielectric layer etch). For example, porous low-k dielectric films can be very susceptible to damage and/or activation during etch processing. In general, porous low-k films are most commonly silicon-oxide based with silanol (Si—OH) groups and/or organo groups. These materials can become activated or damaged due in part to the depletion of an organic component during etch processing.

In either case, additional silanol groups are exposed which can readily absorb water, and/or other contaminants. Accordingly, device structures with exposed low-k dielectric layers are difficult to handle and maintain contaminant free, especially after patterning steps. Moreover, activation and/or damage to the bulk of the low-k material can result in an increase to the dielectric constant (k-value). It has been observed that the activated or damaged low-k film can exhibit an increase of the k-value by a value of one or more.

Figure 3:
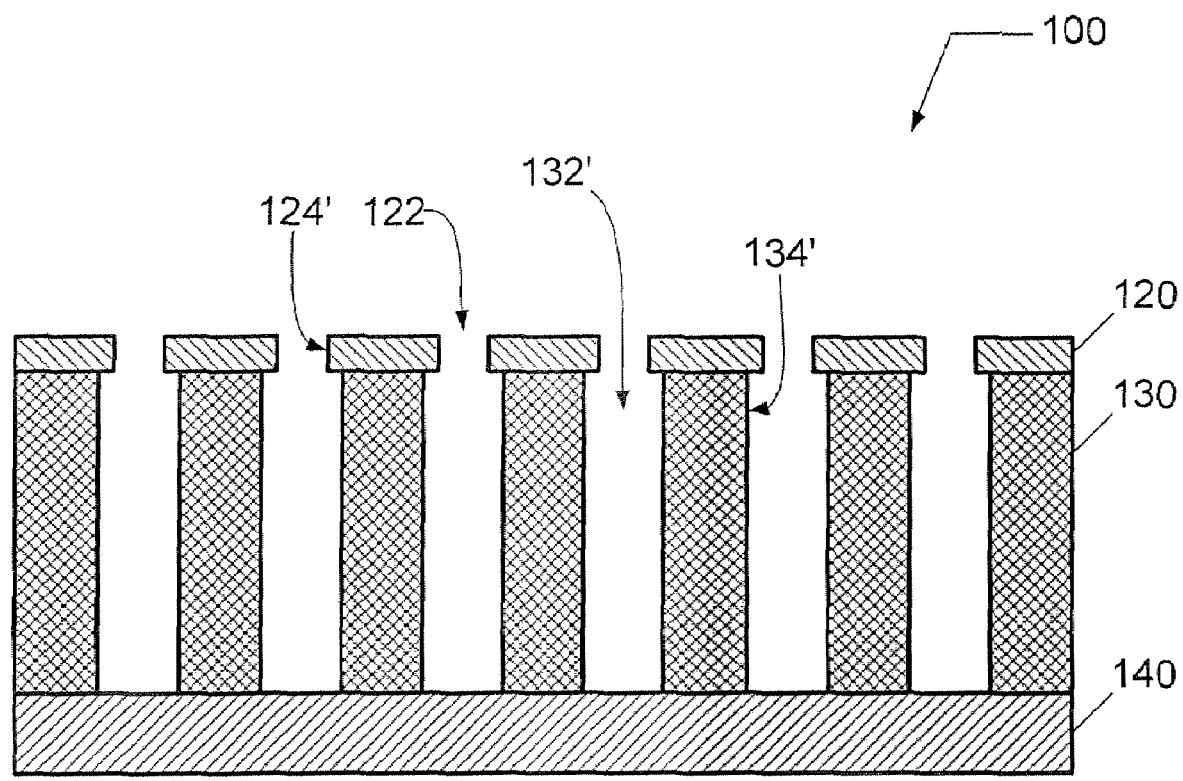
FIG. 3 depicts a bilayer film on a substrate exhibiting an overhang.

Consequently, the damaged material is generally removed using a cleaning process. In the conventional wet cleaning process, the substrate is immersed in HF. However, as illustrated in FIG. 3, the conventional wet cleaning process utilized to remove the damaged material undercuts the hard mask layer 120 leaving a sidewall 124' of hard mask layer 120 overhanging a recessed sidewall 134' in the dielectric layer 130. The undercut in the dielectric layer 130 beneath the overhanging hard mask layer 120, created by the conventional cleaning process, provides a feature 132' that presents challenges during subsequent fill steps, or metallization steps. For example, the feature 132' may make it difficult to get bulk metallization to fill in the space underneath the overhang, resulting in voids at the corners where the cap layer 120 meets the dielectric layer 130 (if the cap layer 120 is left in place) or notches at the metal/dielectric interface (if the cap layer 120 is removed by CMP). Similarly, where a conformal diffusion barrier layer and/or seed layer are applied to the feature prior to metallization fill, such layer(s) may not be adequately applied at the corners where the cap layer 120 meets the dielectric layer 130.

Figure 1F:
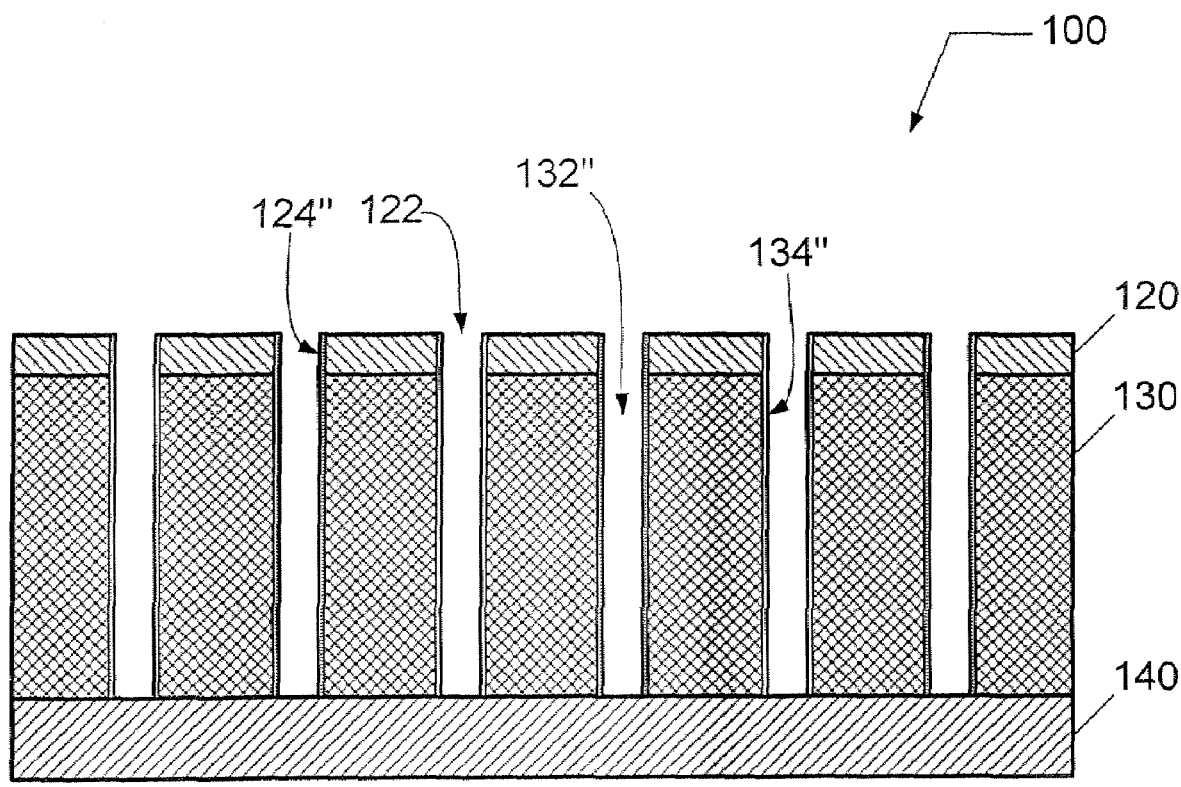
Figure 1G:
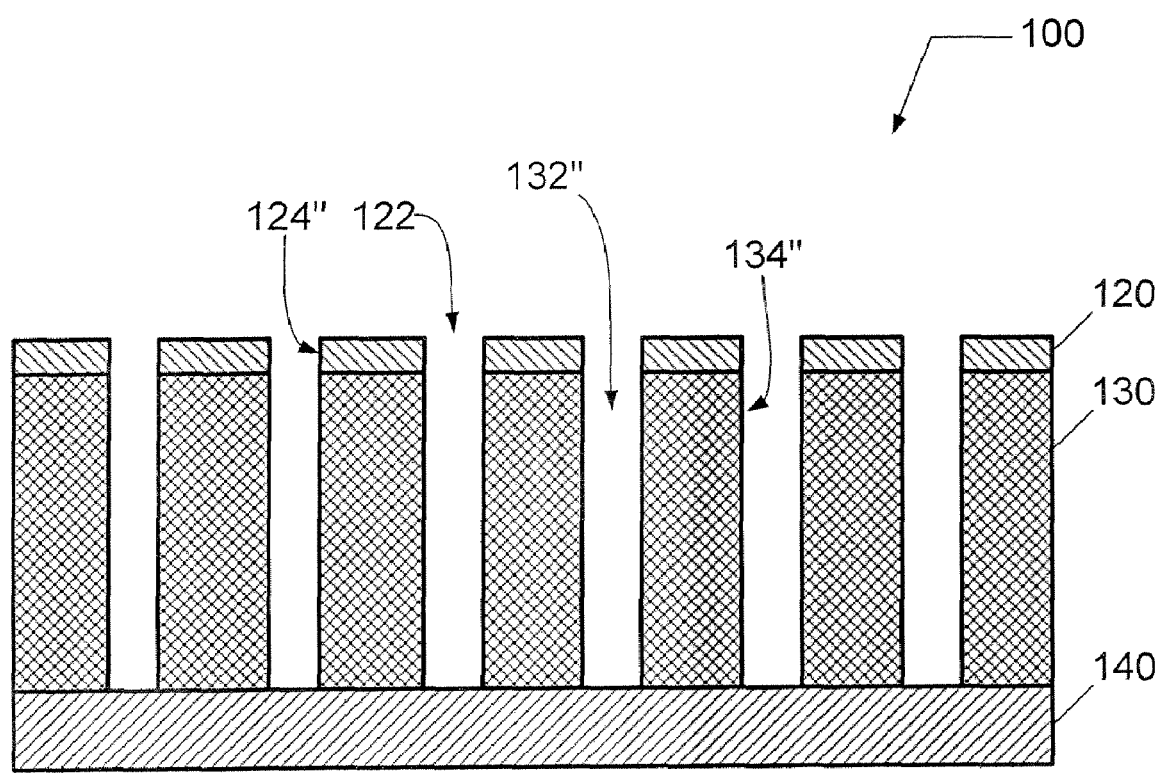

According to an embodiment, the damaged, exposed surfaces 134 (following, for example, an etch process, or an ash process) are removed in step 270 using a dry, non-plasma etching process, as shown in FIGS. 1F and 1G. As noted above, a dry non-plasma etching process includes a self-limiting feature for process control, which can minimize the amount of the sidewall of feature 132" in dielectric layer 130 that is removed. Additionally, as the dry, non-plasma etching process removes the damaged, exposed surfaces of the dielectric layer 130, the process also pulls back the cap layer 120 by substantially the same amount so that approximately no overhang of the cap layer 120 is observed or any observable overhang is reduced. Further, since the removal of damaged material leads to an increase in the critical dimension (CD) of the features 132", in one embodiment the original pattern (i.e., the photo-lithographic pattern 112) can be selected to be smaller than the design CD for the features 132" in dielectric layer 130 to compensate for the subsequent removal of damaged surface area.

The dry, non-plasma etching process includes a chemical process during which exposed surfaces of the dielectric layer 130 and the edge portion of the cap layer 120, as shown in FIG. 1F, are chemically treated by a process gas comprising HF, or ammonia ($NH_3$), or both HF and $NH_3$. Following the chemical treatment process, a desorption process is performed in order to remove the chemically altered surface layers, as shown in FIG. 1G. The desorption can comprise a thermal treatment process within which the temperature of the substrate is raised sufficiently high to permit the volatilization of the chemically altered surface layers. Using the dry, non-plasma etching process, the damaged material on sidewalls 134" in feature 132" can be substantially removed while the edge portion of the cap layer 120 is etched back in order to avoid formation of overhang in the feature 132".

During the chemical treatment process, each constituent of the process gas may be introduced together (i.e., mixed), or separately from one another (i.e., HF introduced independently from $NH_3$). Additionally, the process gas can further include an inert gas, such as a noble gas (i.e., argon). The inert gas may be introduced with either the HF or the $NH_3$, or it may be introduced independently from each of the aforementioned gaseous constituents. Further details regarding the introduction of a noble gas with $NH_3$ in order to control the extent to which surface layers of the dielectric film are chemically altered is described in pending U.S. patent application Ser. No. 10/812,347, entitled "Processing system and method for treating a substrate", the entire contents of which are herein incorporated by reference in their entirety.

Additionally, during the chemical treatment process, the process pressure may be selected to affect the extent to which surface layers of the dielectric film are chemically altered. The process pressure can range from approximately 1 mtorr to approximately 100 torr. Furthermore, during the chemical treatment process, the substrate temperature may be selected to affect the extent to which surface layers of the dielectric film are chemically altered. The substrate temperature can range from approximately 10 degrees C. to approximately 200 degrees C. Further details regarding the setting of the substrate temperature in order to control the extent to which surface layers of the dielectric film are chemically altered is described in pending U.S. patent application Ser. No. 10/817,417, entitled "Method and system for performing a chemical oxide removal process", the entire contents of which are herein incorporated by reference in their entirety.

During the thermal treatment process, the substrate temperature can be elevated above approximately 50 degrees C., or desirably above approximately 100 degrees C. Additionally, an inert gas may be introduced during the thermal treatment of the substrate. The inert gas may include a noble gas or nitrogen.

Figure 4A:
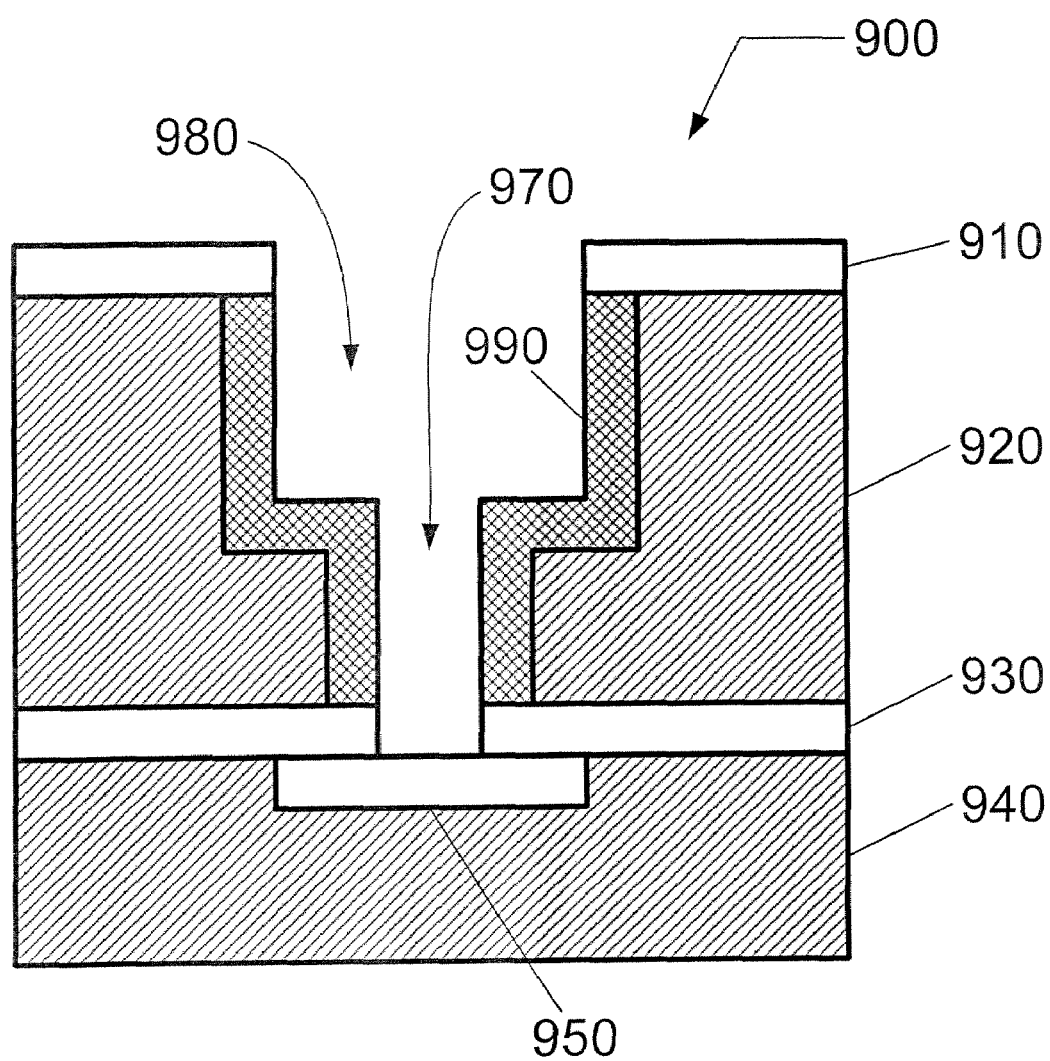
FIGS. 4A and 4B depict an exemplary sequence for processing a substrate when forming a trench or via in a back-end-of-line (BEOL) inter/intra-connect structure.
Figure 4B:
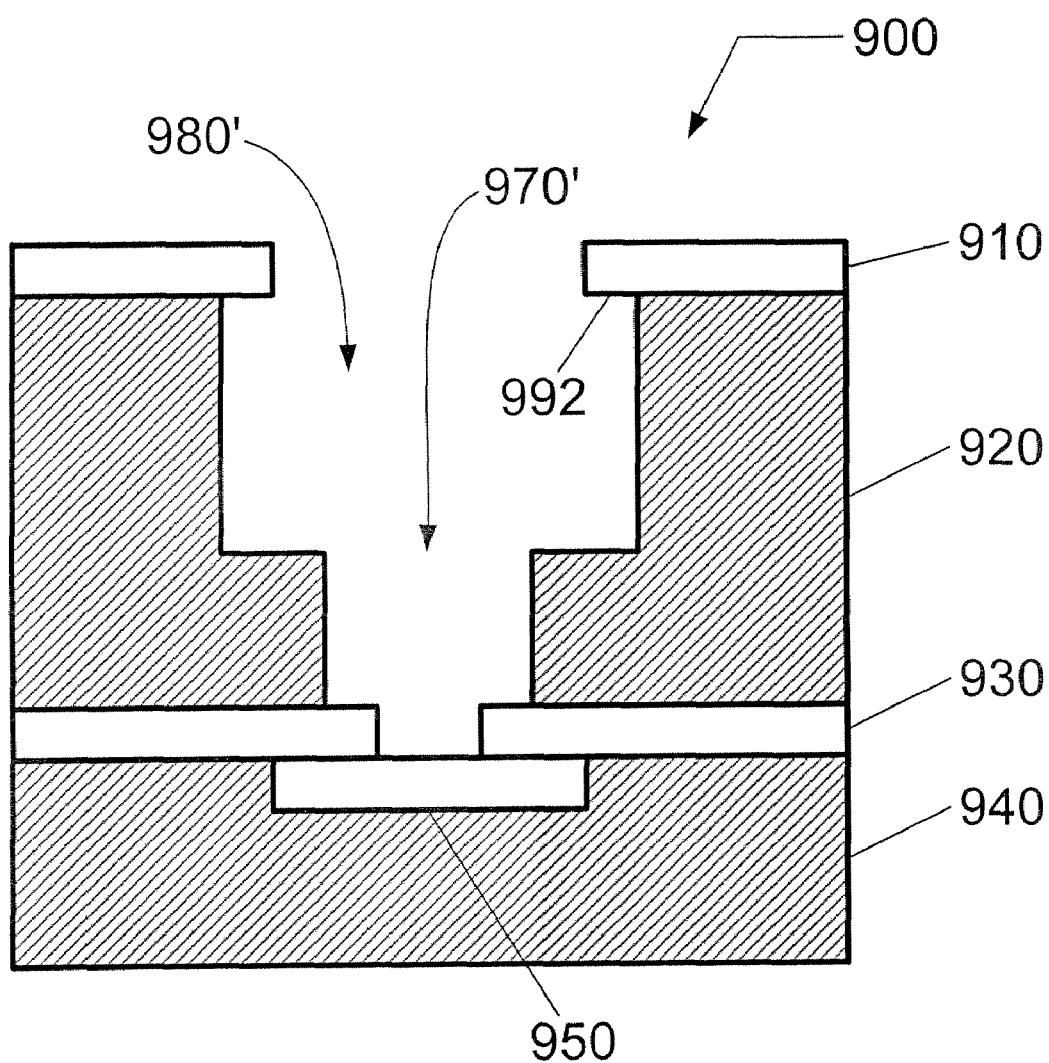

Referring now to FIGS. 4A and 4B, a trench-via interconnect structure 900 is illustrated. Structure 900 comprises a first dielectric layer 940, a first cap layer 930, a second dielectric layer 920, and a second cap layer 910. Therein, a sequence of etching processes are performed in order to create a via 970 and trench 980 which, when metallized in subsequent steps, can permit an electrical interconnection between a second metal line to be formed in trench 980 and a first metal line 950 in the first dielectric layer 940. The first and second dielectric layers 920, 940 may comprise low dielectric constant (low-k) material. The first and second cap layers 910, 930 may comprise $SiO_x$. During the sequence of etch processes, the second dielectric layer 920 is damaged causing a damaged sub layer 990.

As illustrated in FIG. 4B, when removing the damaged sub layer 990 using conventional techniques to create a substantially damage-free via 970' and trench 980', the second cap layer 910 is undercut, thus forming an overhang 992. The overhang 992 can lead to difficulties when metallizing the trench-via structure 900.

Figure 5A:
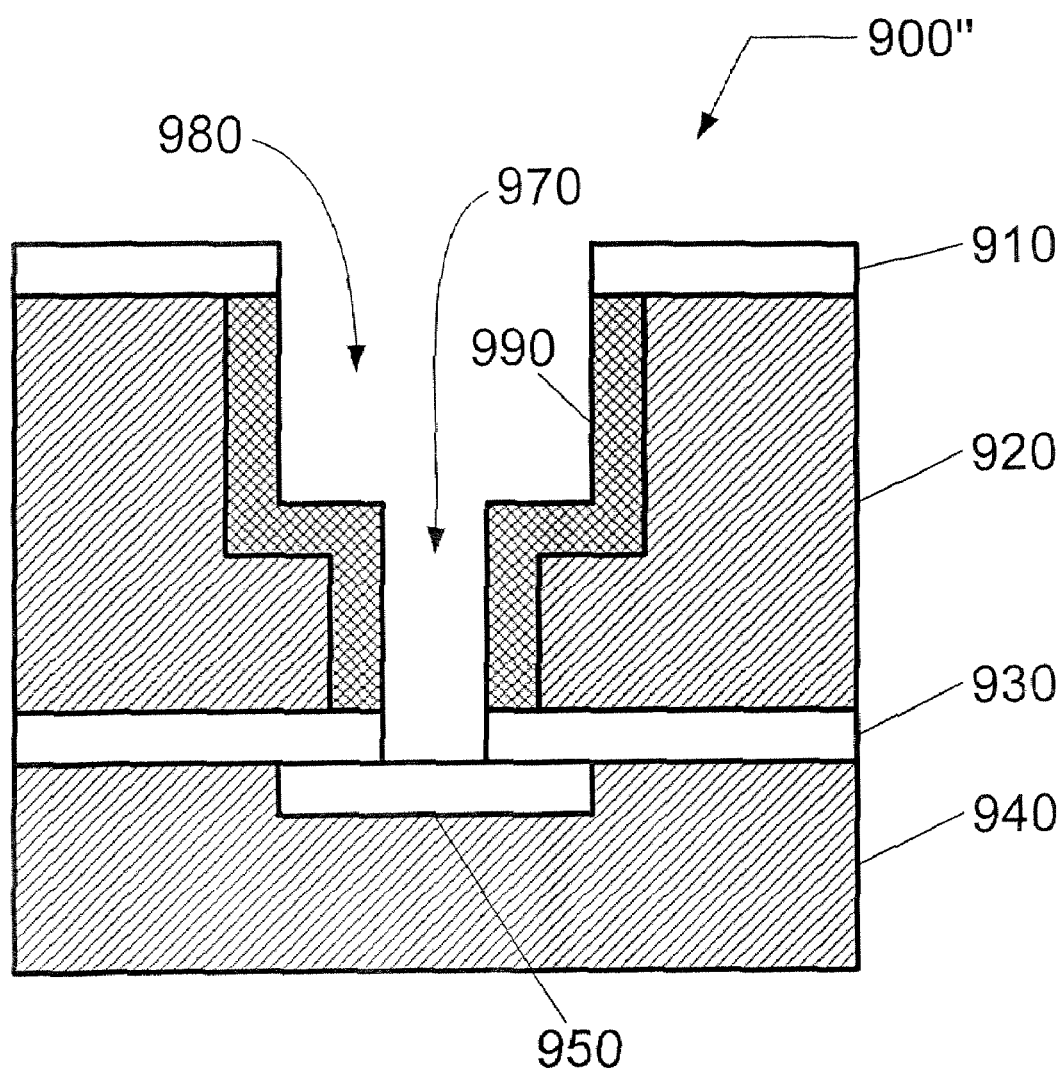
FIGS. 5A, 5B and 5C depict an exemplary sequence for processing a substrate when forming a trench or via in a back-end-of-line (BEOL) inter/intra-connect structure according to another embodiment.
Figure 5B:
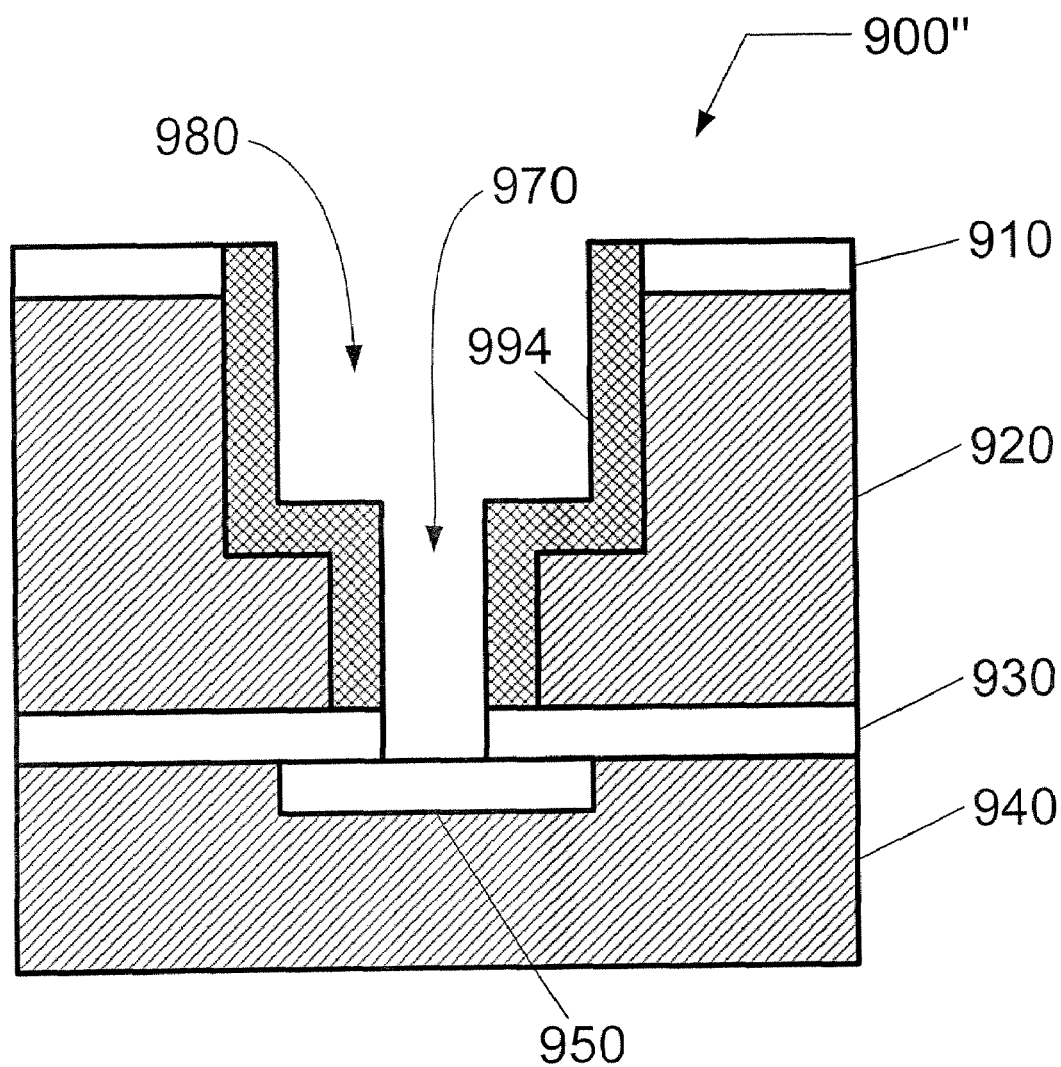
Figure 5C:
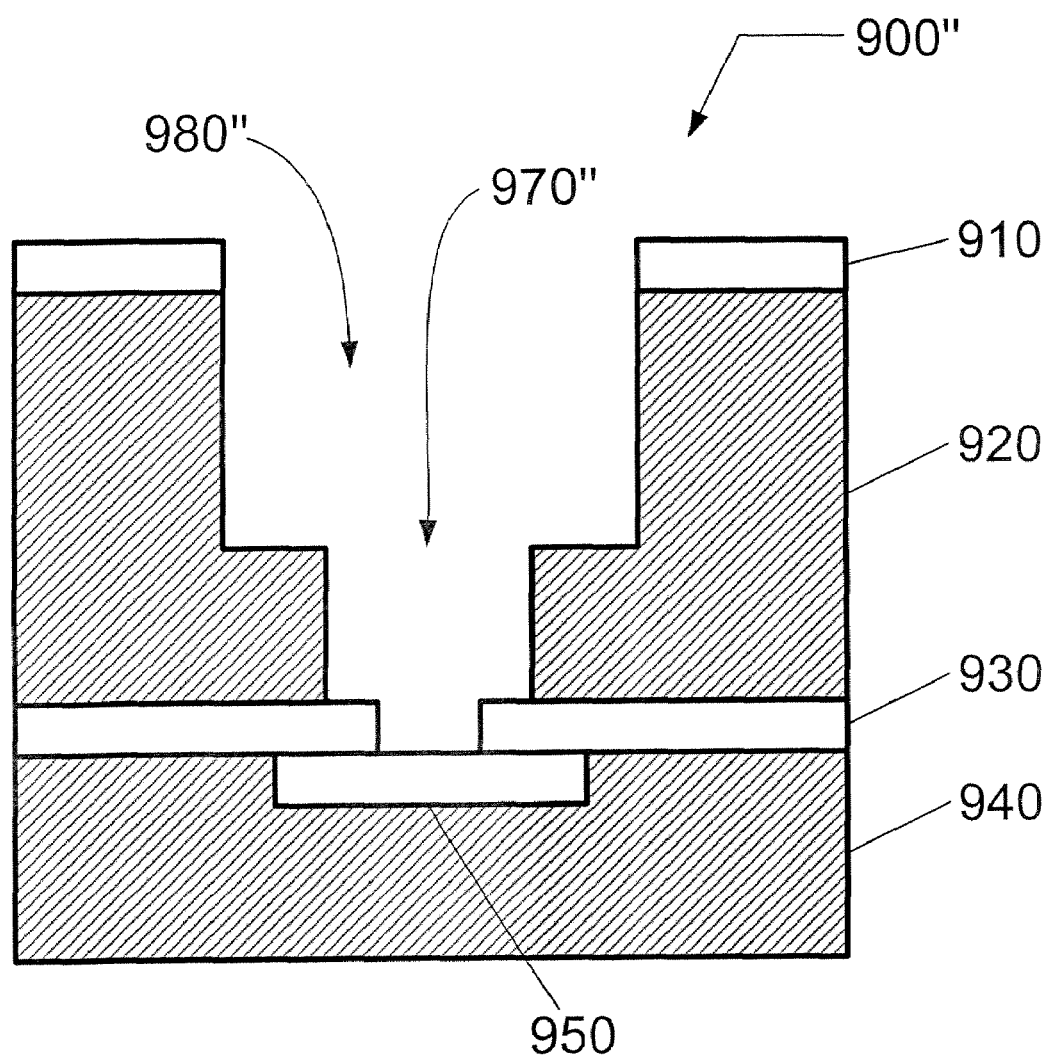

Referring now to FIGS. 5A through 5C, a trench-via interconnect structure 900" is illustrated. According to an embodiment, as illustrated in FIGS. 5B and 5C, the damaged sub layer 990 is removed from the trench-via structure 900 using a dry, non-plasma process as described above. The surface layers 994 of the second dielectric layer 920 and the second cap layer 910 are chemically treated by a process gas comprising HF, or ammonia ($NH_3$), or both HF and $NH_3$. Following the chemical treatment process, a desorption process is performed in order to remove the chemically altered surface layers 994. The desorption can comprise a thermal treatment process within which the temperature of the substrate is raised sufficiently high to permit the volatilization of the chemically altered surface layers. Using the dry, non-plasma etching process can lead to a via 970" and trench 980" in the dielectric layer 920 having reduced damage on sidewalls.

Figure 6A:
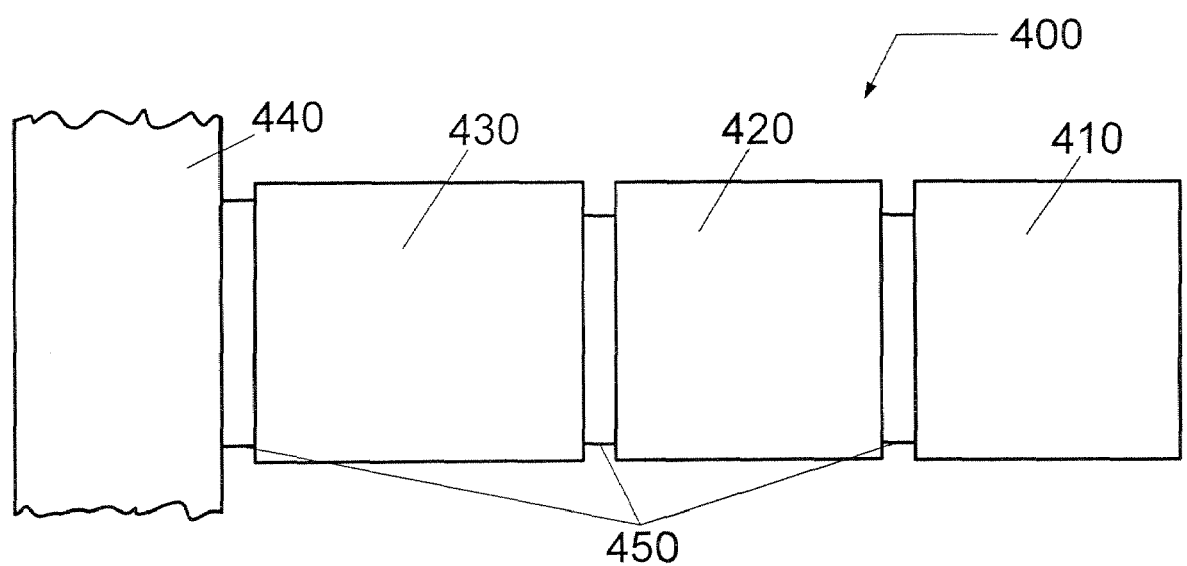
FIGS. 6A through 6C present schematic representations of a treatment system according to another embodiment of the invention.

According to one embodiment, FIG. 6A presents a processing system 400 for performing a dry, non-plasma removal process on a substrate. The processing system 400 comprises a first treatment system 410, and a second treatment system 420 coupled to the first treatment system 410. For example, the first treatment system 410 can comprise a chemical treatment system, and the second treatment system 420 can comprise a thermal treatment system. Alternately, the second treatment system 420 can comprise a substrate rinsing system, such as a water rinsing system.

Also, as illustrated in FIG. 6A, a transfer system 430 can be coupled to the first treatment system 410 in order to transfer substrates into and out of the first treatment system 410 and the second treatment system 420, and exchange substrates with a multi-element manufacturing system 440. The first and second treatment systems 410, 420, and the transfer system 430 can, for example, comprise a processing element within the multi-element manufacturing system 440. For example, the multi-element manufacturing system 440 can permit the transfer of substrates to and from processing elements including such devices as etch systems, deposition systems, coating systems, patterning systems, metrology systems, etc. In order to isolate the processes occurring in the first and second systems, an isolation assembly 450 can be utilized to couple each system. For instance, the isolation assembly 450 can comprise at least one of a thermal insulation assembly to provide thermal isolation, and a gate valve assembly to provide vacuum isolation. Of course, treatment systems 410 and 420, and transfer system 430 can be placed in any sequence.

Figure 6B:
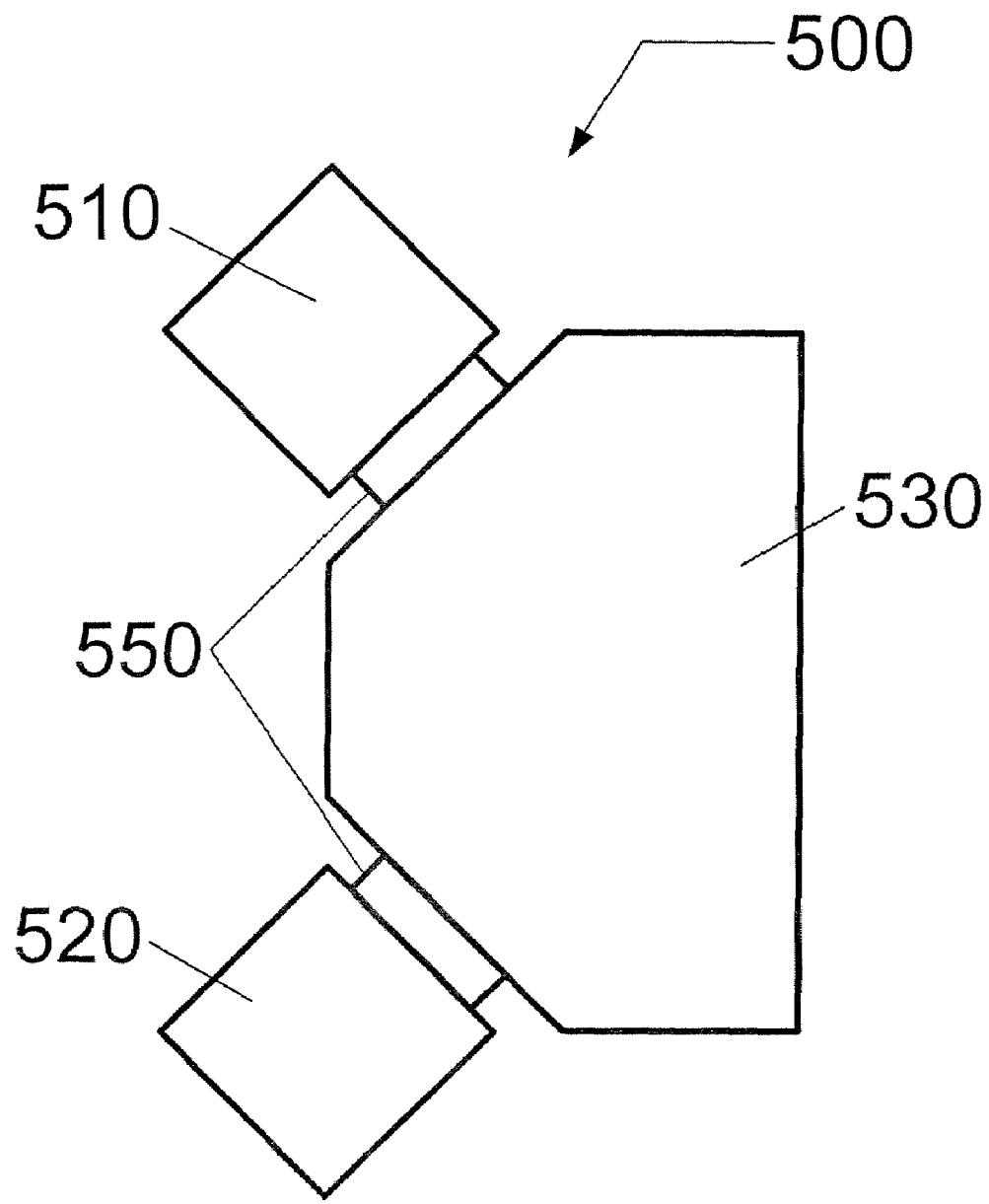

Alternately, in another embodiment, FIG. 6B presents a processing system 500 for performing a dry, non-plasma removal process on a substrate. The processing system 500 comprises a first treatment system 510, and a second treatment system 520. For example, the first treatment system 510 can comprise a chemical treatment system, and the second treatment system 520 can comprise a thermal treatment system. Alternately, the second treatment system 520 can comprise a substrate rinsing system, such as a water rinsing system.

Also, as illustrated in FIG. 6B, a transfer system 530 can be coupled to the first treatment system 510 in order to transfer substrates into and out of the first treatment system 510, and can be coupled to the second treatment system 520 in order to transfer substrates into and out of the second treatment system 520. Additionally, transfer system 530 can exchange substrates with one or more substrate cassettes (not shown). Although only two process systems are illustrated in FIG. 6B, other process systems can access transfer system 530 including such devices as etch systems, deposition systems, coating systems, patterning systems, metrology systems, etc. In order to isolate the processes occurring in the first and second systems, an isolation assembly 550 can be utilized to couple each system. For instance, the isolation assembly 550 can comprise at least one of a thermal insulation assembly to provide thermal isolation, and a gate valve assembly to provide vacuum isolation. Additionally, for example, the transfer system 530 can serve as part of the isolation assembly 550.

Figure 6C:
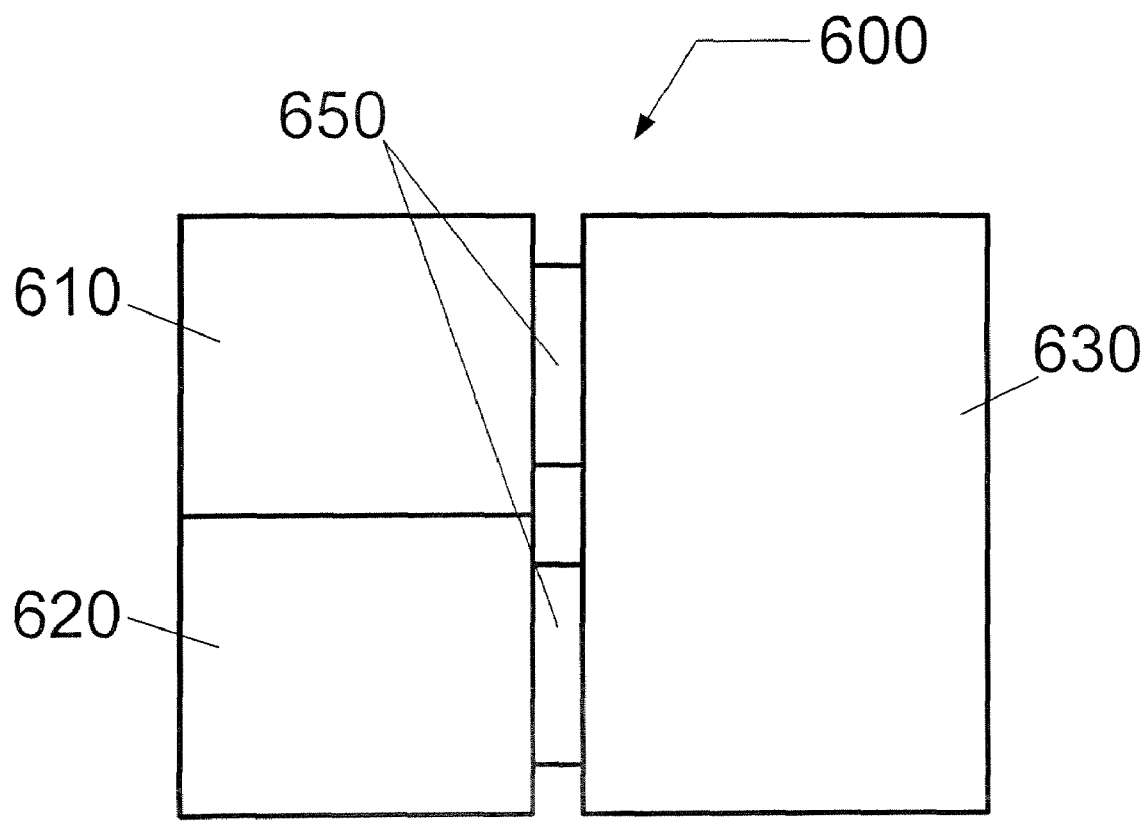

Alternately, in another embodiment, FIG. 6C presents a processing system 600 for performing a dry, non-plasma removal process on a substrate. The processing system 600 comprises a first treatment system 610, and a second treatment system 620, wherein the first treatment system 610 is stacked atop the second treatment system 620 in a vertical direction as shown. For example, the first treatment system 610 can comprise a chemical treatment system, and the second treatment system 620 can comprise a thermal treatment system. Alternately, the second treatment system 620 can comprise a substrate rinsing system, such as a water rinsing system.

Also, as illustrated in FIG. 6C, a transfer system 630 can be coupled to the first treatment system 610 in order to transfer substrates into and out of the first treatment system 610, and can be coupled to the second treatment system 620 in order to transfer substrates into and out of the second treatment system 620. Additionally, transfer system 630 can exchange substrates with one or more substrate cassettes (not shown). Although only two process systems are illustrated in FIG. 6C, other process systems can access transfer system 630 including such devices as etch systems, deposition systems, coating systems, patterning systems, metrology systems, etc. In order to isolate the processes occurring in the first and second systems, an isolation assembly 650 can be utilized to couple each system. For instance, the isolation assembly 650 can comprise at least one of a thermal insulation assembly to provide thermal isolation, and a gate valve assembly to provide vacuum isolation. Additionally, for example, the transfer system 630 can serve as part of the isolation assembly 650.

Figure 7:
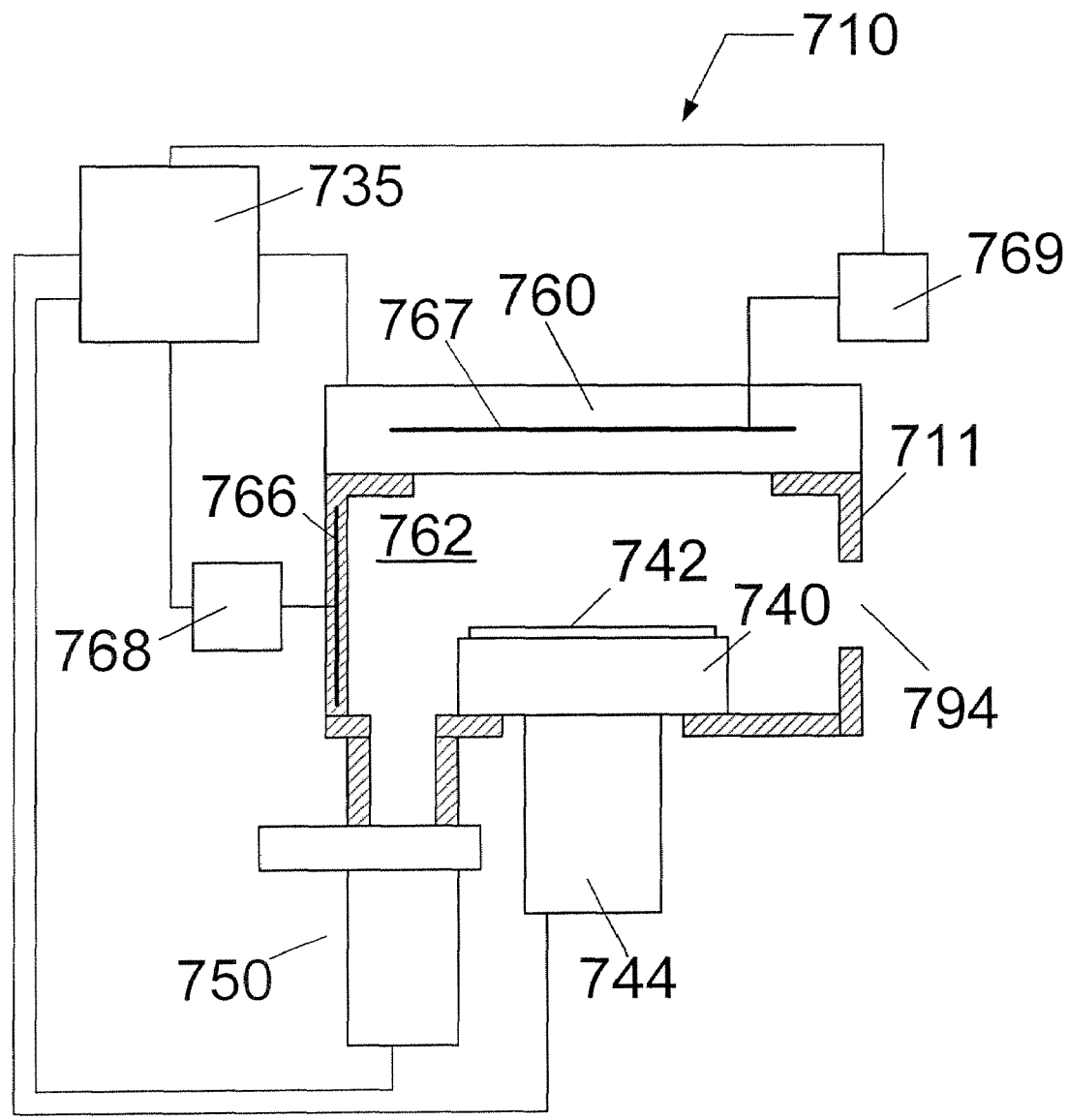
FIG. 7 presents a chemical treatment system according to another embodiment of the invention.

As illustrated in FIG. 7, a chemical treatment system 710 comprises a temperature controlled substrate holder 740 configured to be substantially thermally isolated from the chemical treatment chamber 711 and configured to support a substrate 742, a vacuum pumping system 750 coupled to the chemical treatment chamber 711 to evacuate the chemical treatment chamber 711, and a gas distribution system 760 for introducing a process gas into a process space 762 within the chemical treatment chamber 711. Substrate 742 can be transferred into and out of chemical treatment chamber 711 through transfer opening 794.

Additionally, the chemical treatment system 710 comprises a chamber temperature control element 766 coupled to a chamber temperature control system 768. The chamber temperature control element 766 can include a heating unit, or a cooling unit, or both. Furthermore, the chemical treatment system 710 comprises a gas distribution temperature control element 767 coupled to a gas distribution temperature control system 769. The gas distribution temperature control element 767 can include a heating unit, or a cooling unit, or both.

As illustrated in FIG. 7, the chemical treatment system 710 further comprises substrate holder 740 having a substrate holder assembly 744. Substrate holder assembly 755 can provide several operational functions for thermally controlling and processing substrate 742. For example, the substrate holder 740 and substrate holder assembly 744 may or may not comprise a substrate clamping system (i.e., electrical or mechanical clamping system), a heating system, a cooling system, a substrate backside gas supply system for improved thermal conductance between the substrate 742 and the substrate holder 740, etc.

Referring still to FIG. 7, a controller 735 may be coupled to the substrate holder assembly 744, the gas distribution system 760, the vacuum pumping system 750, the chamber temperature control system 768, and the gas distribution temperature control system 769. The controller 735 can include a microprocessor, memory, and a digital I/O port capable of generating control voltages sufficient to communicate and activate inputs to chemical treatment system 710 as well as monitor outputs from chemical treatment system 710.

Further details regarding the chemical treatment system 710 are described in U.S. Pat. No. 6,951,821 A1, entitled "Processing system and method for chemically treating a substrate"; the entire contents of which are incorporated herein by reference in their entirety.

Figure 8:
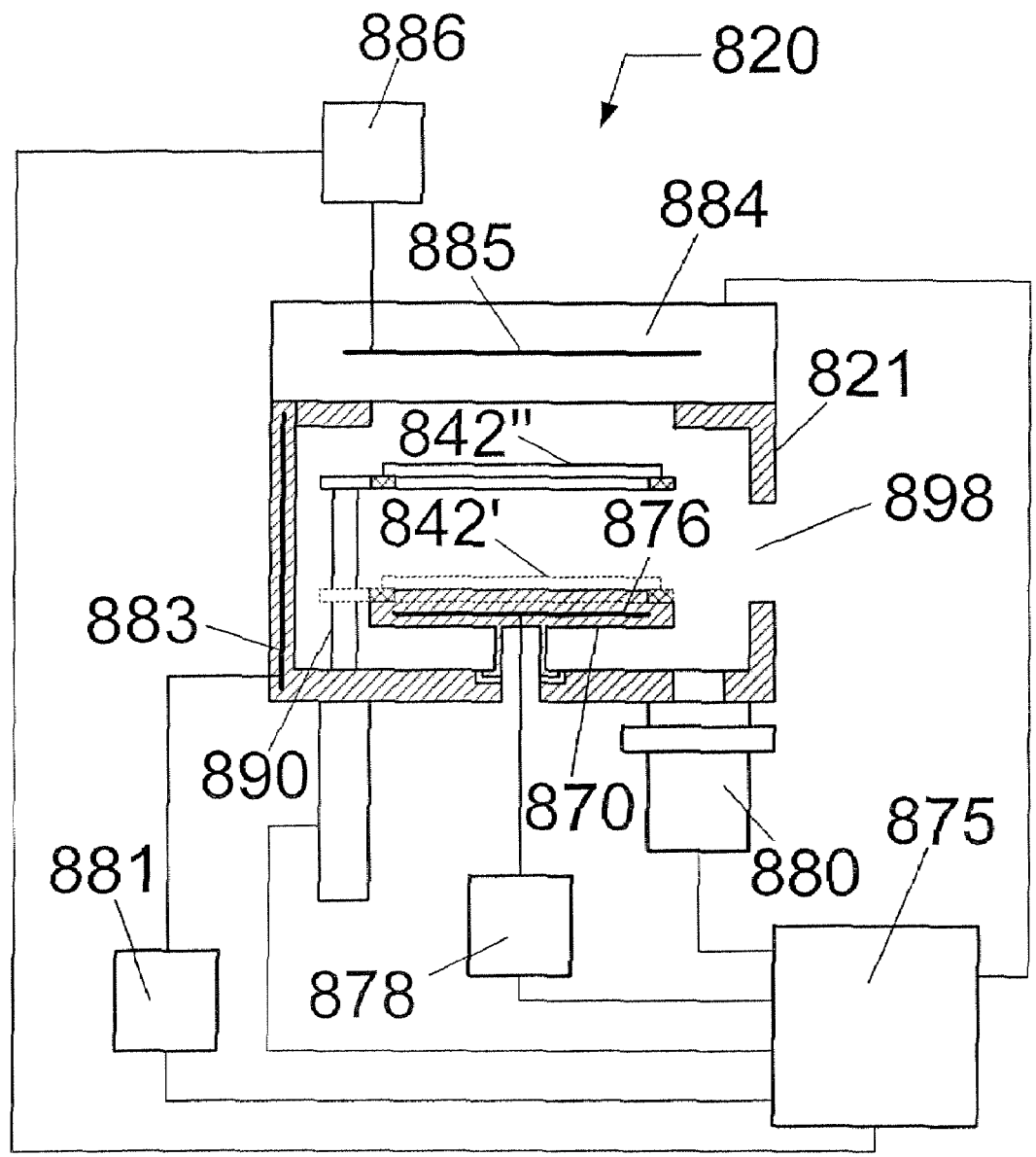
FIG. 8 presents a thermal treatment system according to another embodiment of the invention.

As illustrated in FIG. 8, a thermal treatment system 820 further comprises a temperature controlled substrate holder 870 mounted within the thermal treatment chamber 821 and configured to be substantially thermally insulated from the thermal treatment chamber 821 and configured to support a substrate 842', a vacuum pumping system 880 to evacuate the thermal treatment chamber 821, and a substrate lifter assembly 890 coupled to the thermal treatment chamber 821. Lifter assembly 890 can vertically translate the substrate 842" between a holding plane (solid lines) and the substrate holder 870 (dashed lines), or a transfer plane located therebetween. The thermal treatment chamber 821 can further comprise an upper assembly 884 that may be configured to introduce a process gas, such as a purge gas, during thermal treatment of substrate 842'. Substrate 842' (or 842") can be transferred into and out of chemical treatment chamber 821 through transfer opening 898.

Additionally, the thermal treatment system 820 comprises a chamber temperature control element 883 coupled to a chamber temperature control system 881. The chamber temperature control element 883 can include a heating unit, or a cooling unit, or both. Furthermore, the thermal treatment system 820 comprises an upper assembly temperature control element 885 coupled to an upper assembly temperature control system 886. The upper assembly temperature control element 885 can include a heating unit, or a cooling unit, or both.

As illustrated in FIG. 8, the thermal treatment system 820 comprises substrate holder 870 having a substrate holder temperature control element 876 and a substrate holder temperature control system 878. The substrate holder temperature control element 876 can include a heating element, such as a resistive heating element. Furthermore, for example, the substrate holder 870 may or may not comprise a substrate clamping system (i.e., electrical or mechanical clamping system), an additional heating system, a cooling system, a substrate backside gas supply system for improved thermal conductance between the substrate 842' and the substrate holder 870, etc.

Referring still to FIG. 8, a controller 875 may be coupled to the upper assembly 884, the vacuum pumping system 880, the chamber temperature control system 881, the upper assembly temperature control system 886, the substrate holder temperature control system 878, and the substrate lifter assembly 890. The controller 875 can include a microprocessor, memory, and a digital I/O port capable of generating control voltages sufficient to communicate and activate inputs to thermal treatment system 820 as well as monitor outputs from thermal treatment system 820.

Further details regarding the thermal treatment system 820 are described in pending U.S. patent application Ser. No. 10/704,969, entitled "Processing system and method for thermally treating a substrate"; the entire contents are incorporated herein by reference in their entirety.

Although only certain exemplary embodiments of inventions have been described in detail above, those skilled in the art will readily appreciate that many modifications are possible in the exemplary embodiments without materially departing from the novel teachings and advantages of this invention.

The invention claimed is:

1. A method of treating a dielectric film on a substrate, comprising:
    disposing said substrate having said dielectric film and a capping layer overlying said dielectric film in a treatment system, wherein a pattern has been transferred to said capping layer and said dielectric film in order to form a feature through said capping layer and within said dielectric film, and wherein a surface layer of said dielectric film has been exposed to an etching plasma during a pattern transfer; and
    performing a dry non-plasma removal process on said capping layer and said dielectric film to remove an exposed surface layer of said dielectric film and a portion of said capping layer, said dry non-plasma removal process comprising:
    exposing said exposed surface layer of said dielectric film and said portion of said capping layer to a process gas comprising HF or $NH_3$ or a combination thereof in order to chemically alter said exposed surface layer of said dielectric film and said portion of said capping layer; and
    thermally treating said chemically altered exposed surface layer of said dielectric film and said chemically altered portion of said capping layer in order to desorb said chemically altered exposed surface layer and said chemically altered portion,
    wherein said performing said dry non-plasma removal process avoids formation of an overhang within said feature, and
    wherein said capping layer comprises at least one of silicon oxide, silicon nitride, and carbon.

2. The method of claim 1, wherein said exposing further comprises exposing a surface layer of a dielectric film having a dielectric constant ranging from 1.6 to 2.7.

3. The method of claim 1, wherein said exposing further comprises exposing a surface layer of a porous dielectric film or a non-porous dielectric film or a combination thereof.

4. The method of claim 1, wherein said exposing further comprises exposing a surface layer of a porous dielectric film comprising a single-phase material or a dual-phase material or a combination thereof.

5. The method of claim 1, wherein said exposing further comprises exposing a surface layer of a film including an organic material or an inorganic material or a combination thereof.

6. The method of claim 5, wherein said exposing further comprises exposing a surface layer of a film including an inorganic-organic hybrid material.

7. The method of claim 5, wherein said exposing comprises exposing a surface layer of a film including an oxidized organo silane.

8. The method of claim 5, wherein said exposing further comprises exposing a surface layer of a film including hydrogen silsesquioxane or methyl silsesquioxane or a combination thereof.

9. The method of claim 5, wherein said exposing further comprises exposing a surface layer of a film including a silicate-based material.

10. The method of claim 5, wherein said exposing further comprises exposing a surface layer of a collective film including silicon, carbon, and oxygen.

11. The method of claim 10, wherein said exposing further comprises exposing a surface layer of said collective film further including hydrogen.

12. The method of claim 1, wherein said exposing is performed at a process pressure ranging from approximately 1 mtorr to approximately 100 torr.

13. The method of claim 1, wherein said exposing is performed while said substrate is at a temperature ranging from approximately 10 degrees C. to approximately 200 degrees C.

14. The method of claim 1, wherein said exposing further comprises exposing said substrate to a process gas further comprising an inert gas.

15. The method of claim 14, wherein said exposing further comprises exposing said substrate to a process gas further comprising a noble gas.

16. The method of claim 1, wherein said thermally treating further comprises elevating a temperature of said substrate to above approximately 50 degrees C.

17. The method of claim 1, wherein said thermally treating further comprises elevating a temperature of said substrate to above approximately 100 degrees C.

18. The method of claim 17, wherein said thermally treating is performed during introducing an inert gas.

19. The method of claim 18, wherein said introducing further comprises introducing a nitrogen.

20. The method of claim 1, wherein said exposing said exposed surface layer of said dielectric film and said portion of said capping layer to a process gas comprises exposing said exposed surface layer of said dielectric film and said portion of said capping layer to a process gas comprising HF and $NH_3$.

21. The method of claim 1, wherein said pattern further comprises a trench, or a via, or a combination thereof.

* * * * *